United States Patent [19]
Conzelmann et al.

[11] Patent Number: 5,394,032
[45] Date of Patent: Feb. 28, 1995

[54] PROGRAMMING DETAILS OF A PROGRAMMABLE CIRCUIT

[75] Inventors: Gerhard Conzelmann, Leinfelden-Oberaichen; Gerhard Fiedler, Neckartailfingen; Ulrich Fleischer, Pliezhausen, all of Germany

[73] Assignee: Robert Bosch GmbH

[21] Appl. No.: 15,747

[22] Filed: Feb. 10, 1993

[30] Foreign Application Priority Data

Mar. 7, 1992 [DE] Germany ............... 4207226

[51] Int. Cl.⁶ ............................... H01L 25/00
[52] U.S. Cl. ............................. 326/38; 326/41; 327/525; 327/565
[58] Field of Search ............. 307/465, 465.1, 482.1, 307/303, 303.1, 202.1

[56] References Cited

U.S. PATENT DOCUMENTS

| | | | |
|---|---|---|---|
| 4,937,465 | 6/1990 | Johnson et al. | 307/202.1 |
| 5,099,149 | 3/1992 | Smith | 307/202.1 |
| 5,148,391 | 9/1992 | Zagar | 307/202.1 |
| 5,151,611 | 9/1992 | Rippey | 307/202.1 |
| 5,166,556 | 11/1992 | Hsu et al. | 307/202.1 |
| 5,223,754 | 6/1993 | Decker et al. | 307/202.1 |

FOREIGN PATENT DOCUMENTS

| | | |
|---|---|---|
| 0251212 | 1/1988 | European Pat. Off. . |
| 030176 | 1/1990 | Japan . |
| 044337 | 2/1992 | Japan . |

*Primary Examiner*—Edward P. Westin
*Assistant Examiner*—Richard Roseen
*Attorney, Agent, or Firm*—Kenyon & Kenyon

[57] ABSTRACT

A monolithically integrated circuit in the packed state has at least one characteristic value and/or at least one function which is able to be varied by applying at least one striking potential to at least two of the standard terminal connections leading to the outside of the integrated circuit.

14 Claims, 5 Drawing Sheets

PROGRAMMING DETAILS OF A PROGRAMMABLE CIRCUIT

FIELD OF THE INVENTION

The present invention relates to an integrated circuit and in particular to a monolithically integrated circuit having at least one characteristic value and/or at least one function which is able to be varied.

BACKGROUND INFORMATION

The demands placed on the characteristics of integrated circuits are becoming increasingly greater. Adjusting hybrid circuits during manufacturing, particularly by means of a laser, and adjusting monolithically integrated circuits on the wafer, in the case of a wafer specimen, by applying current impulses to fuse printed-conductor bridge circuits or to short-circuit components, for example by means of Zener zapping, are proven means for meeting relatively high demands. However, these solutions have their limitations during further processing in the assembly operation. In particular, mechanical strains of a greater or lesser scale, which alter the characteristics of individual components to a greater or lesser degree, occur.

For this reason, it is known to adjust or correct packed components, whereby an additional connecting lead is required for each adjusting or correcting step. The known methods are also applied to program functional variants, or for the one-time programming of ROMs in digital technology.

European Patent Application No. 0 251 212 describes a method for adjusting resistor networks, which is also suited for adjusting packed components. To accomplish this, however, at least one additional connecting lead is needed for each adjusting or programming step.

SUMMARY OF THE INVENTION

The integrated circuit according to the present invention includes at least one circuit element; at least two terminal connections coupled to the at least one circuit element, the at least two terminal connections receiving a striking potential; and means for short-circuiting the at least one circuit element to adjust at least one of a characteristic value and a function of the integrated circuit in response to the striking potential.

The integrated circuit according to the present invention allows for a re-adjustment or reprogramming in the packed state without any, or with a minimum number of, additional terminal connections. In this manner, when an adjustment is made before the assembly operation, it is possible to compensate-for drifts in the adjustment caused by the assembly operation and, consequently, to increase efficiency, or to subsequently re-program functions of pre-stored components. Each of these measures helps to lower costs.

DETAILED DESCRIPTION

Figure 1:
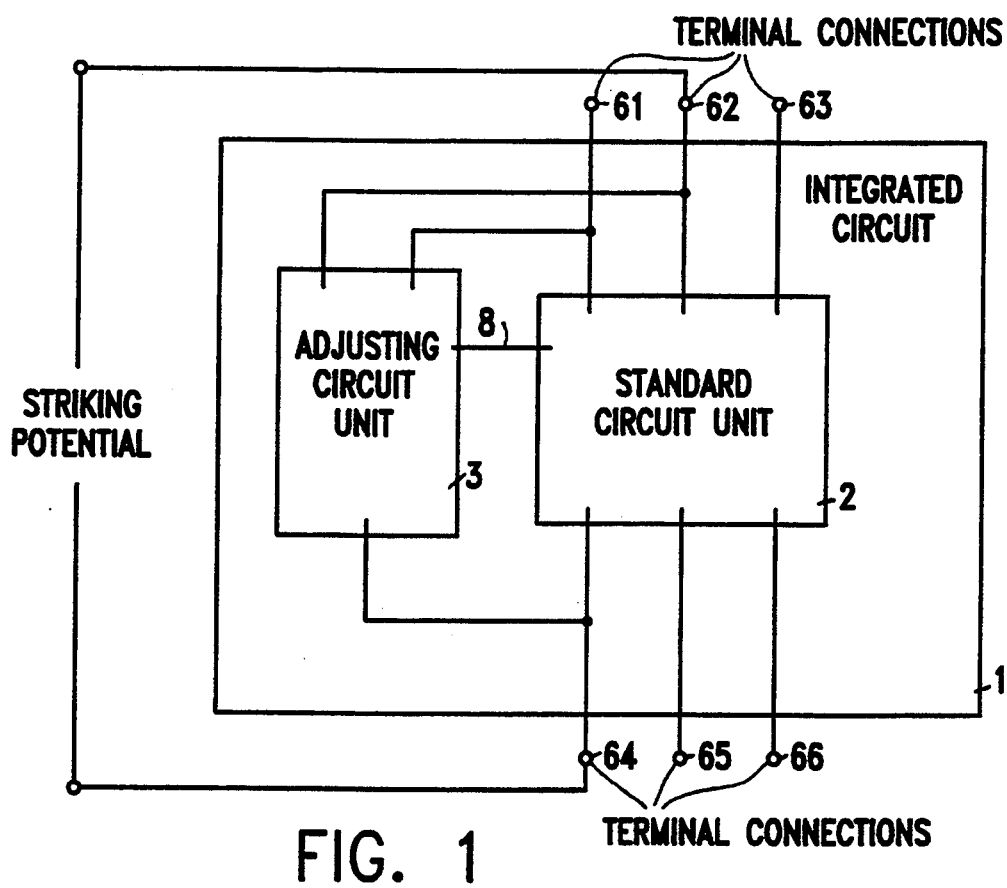
FIG. 1 shows a first embodiment of a monolithically integrated circuit according to the present invention.

In principle, the proposed adjustment processes require current impulses to fuse fusible conductors, to short-circuit circuit elements, or the like. These processes are carried out by applying striking (firing) potentials. In order to be able to use standard terminal connections of an integrated circuit for this purpose, these striking potentials must lie outside of the operating potentials of these terminal connections. This is accomplished, for instance, by varying polarity and/or amplitude, which is achieved by applying suitable selection means to ensure that the adjusting or programming function is initiated only by the designated striking potentials. Suited as selection means are semiconductor sections having at least one p-n junction, such as diodes, Z-diodes, transistors, thyristors, diacs, or the like, as well as capacitor-resistor combinations as differentiating or integrating elements. The circuit arrangement for selecting the firing pulses can include a combination of several of the above-mentioned selection means. Care must be taken in dimensioning these selections means to ensure that conducted and received interference can be superimposed during the operation of an integrated circuit according to the present invention, for example in a motor vehicle, and to ensure that this interference does not trigger any adjustment or programming functions. This requirement, together with the requirement that the circuit element in question must not be damaged by the striking potential, is satisfied quite easily from a standpoint of circuit engineering by an additional terminal connection. This can also be advantageous when many operations need to be carried out on the packed integrated circuit.

In all of the Figures, the same components are given the same reference numerals. Thus, the entire integrated circuit is always designated by the reference numeral 1. The integrated circuit 1 includes a standard circuit unit 2, and either one circuit unit 3 or several circuit units 31, 32, etc., which are used to carry out adjusting or programming operations.

Of the multitude of possible logic elements that can be used to perform logic operations, only the AND gates 4 and the inverter 5 are used in this case. Terminal connections leading to the outside of the integrated circuit 1 are designated by reference numerals 61, 62, etc.; these designations are also used for those lines leading to the inside of the integrated circuit 1. Line sections inside the integrated circuit, more or less along the lines of a logic circuit, are designated by the reference numeral 7. The circuit unit 3, or the circuit units 31, 32, etc. interconnect with the standard circuit unit 2 via line 8, or via lines 81, 82, etc.

Figure 3:
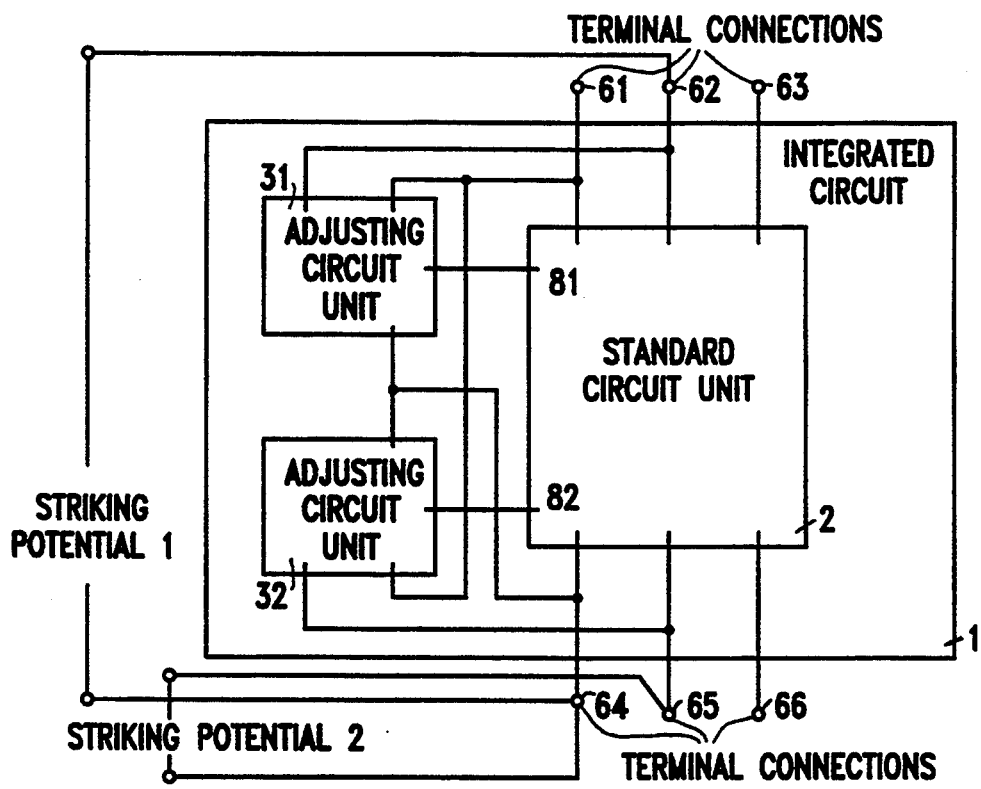
FIG. 3 shows a third embodiment of a monolithically integrated circuit according to the present invention.
Figure 4:
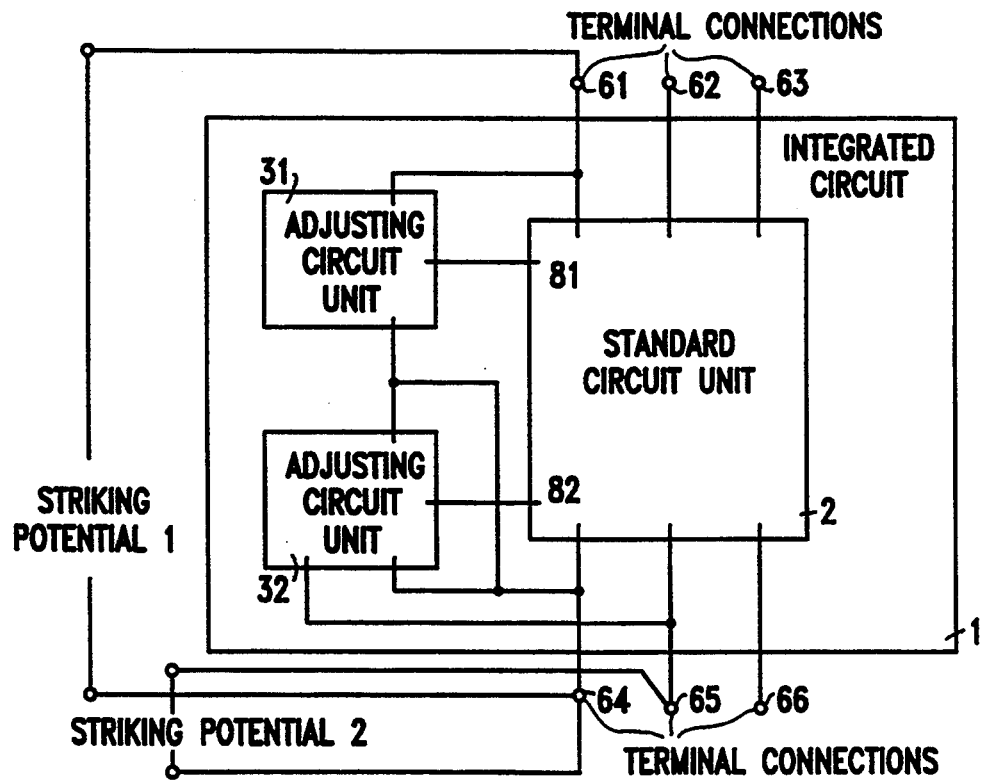
FIG. 4 shows a fourth embodiment of a monolithically integrated-circuit according to the present invention.
Figure 5:
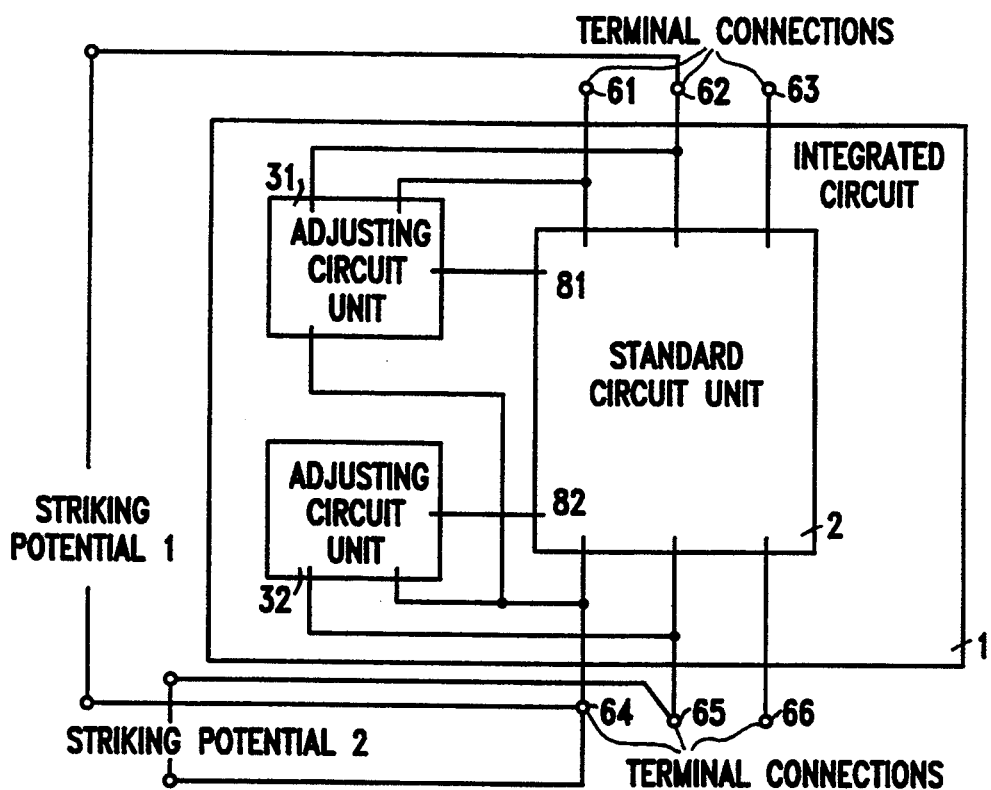
FIG. 5 shows a fifth embodiment of a monolithically integrated circuit according to the present invention.
Figure 6:
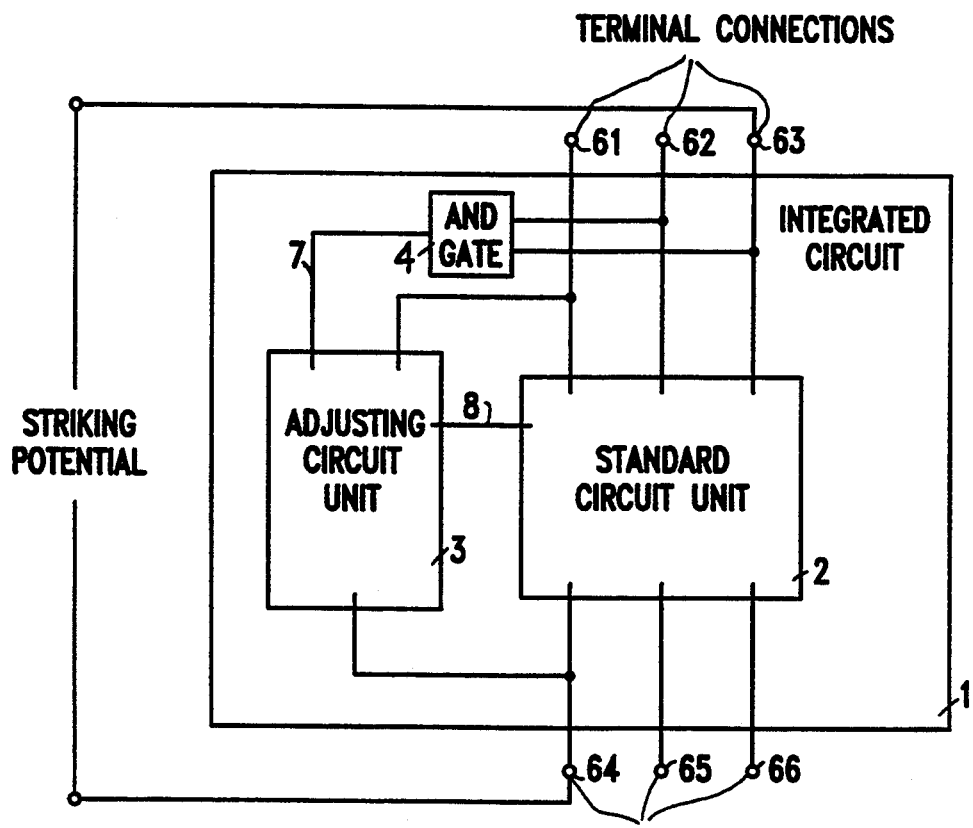
FIG. 6 shows a sixth embodiment of a monolithically integrated circuit according to the present invention.
Figure 7:
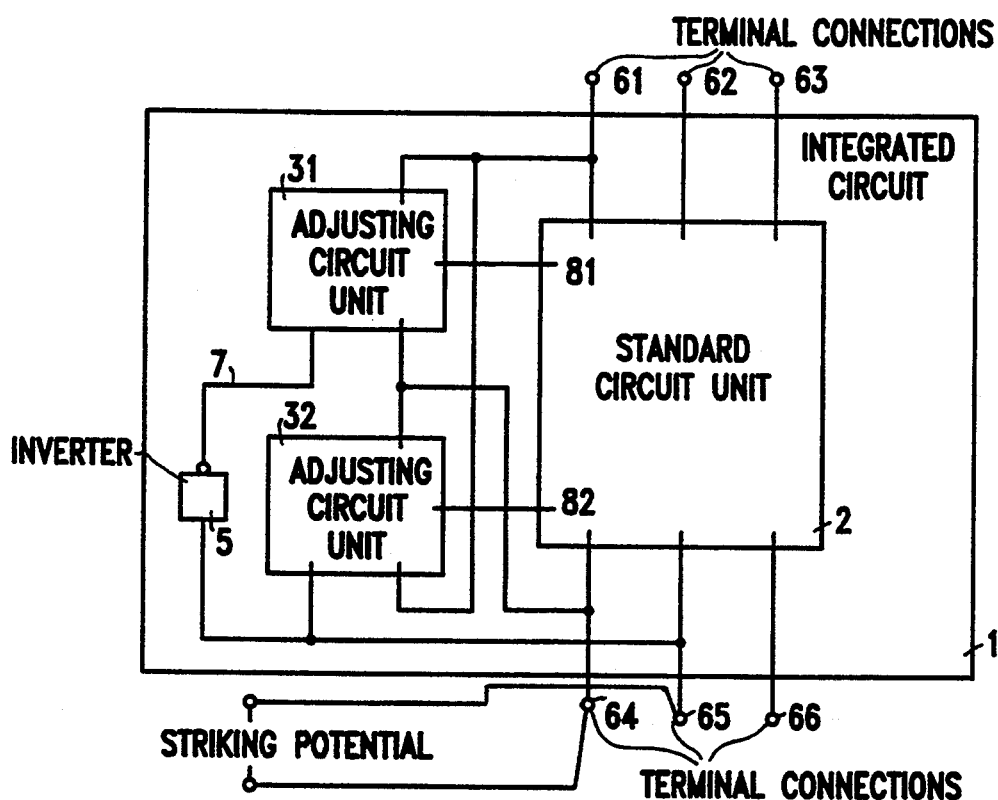
FIG. 7 shows a seventh embodiment of a monolithically integrated circuit according to the present invention.
Figure 8:
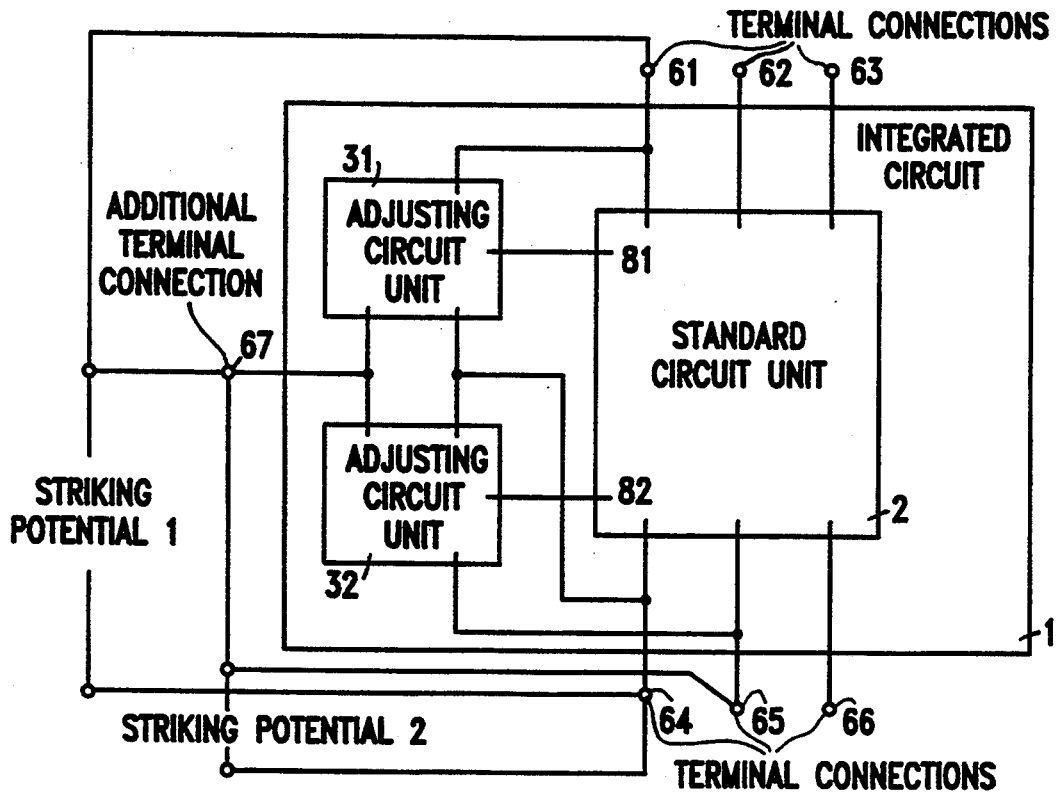
FIG. 8 shows an eighth embodiment of a monolithically integrated circuit according to the present invention.
Figure 9:
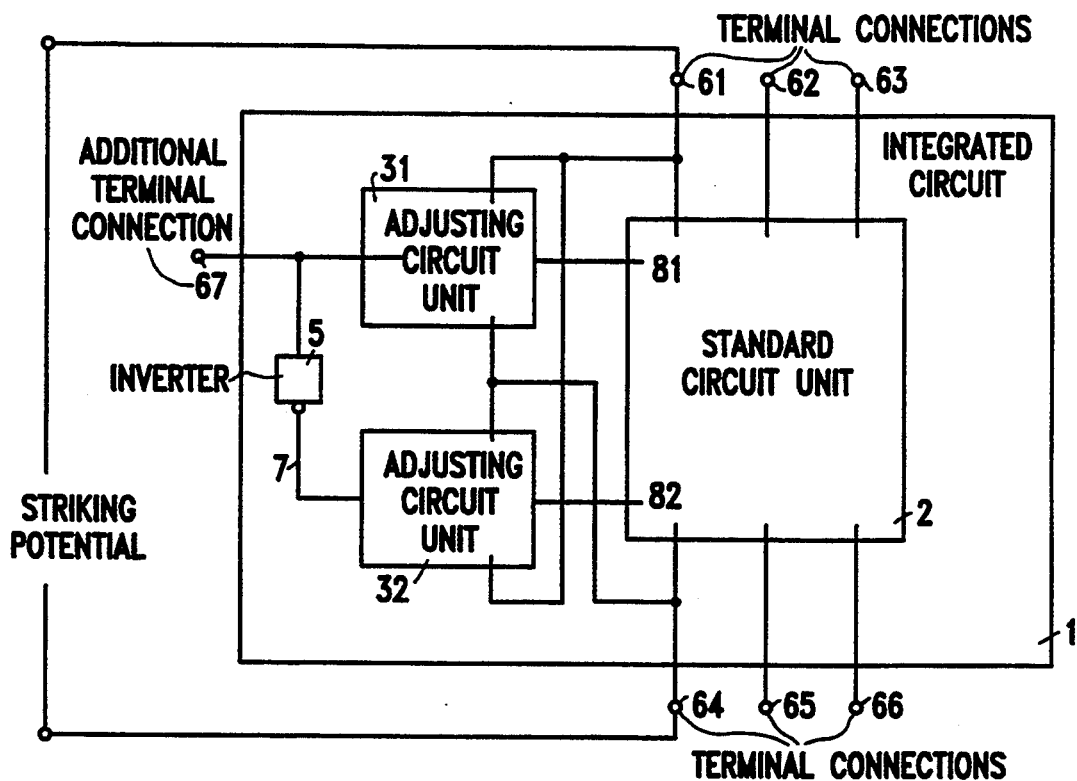
FIG. 9 shows a ninth embodiment of a monolithically integrated circuit according to the present invention.
Figure 10:
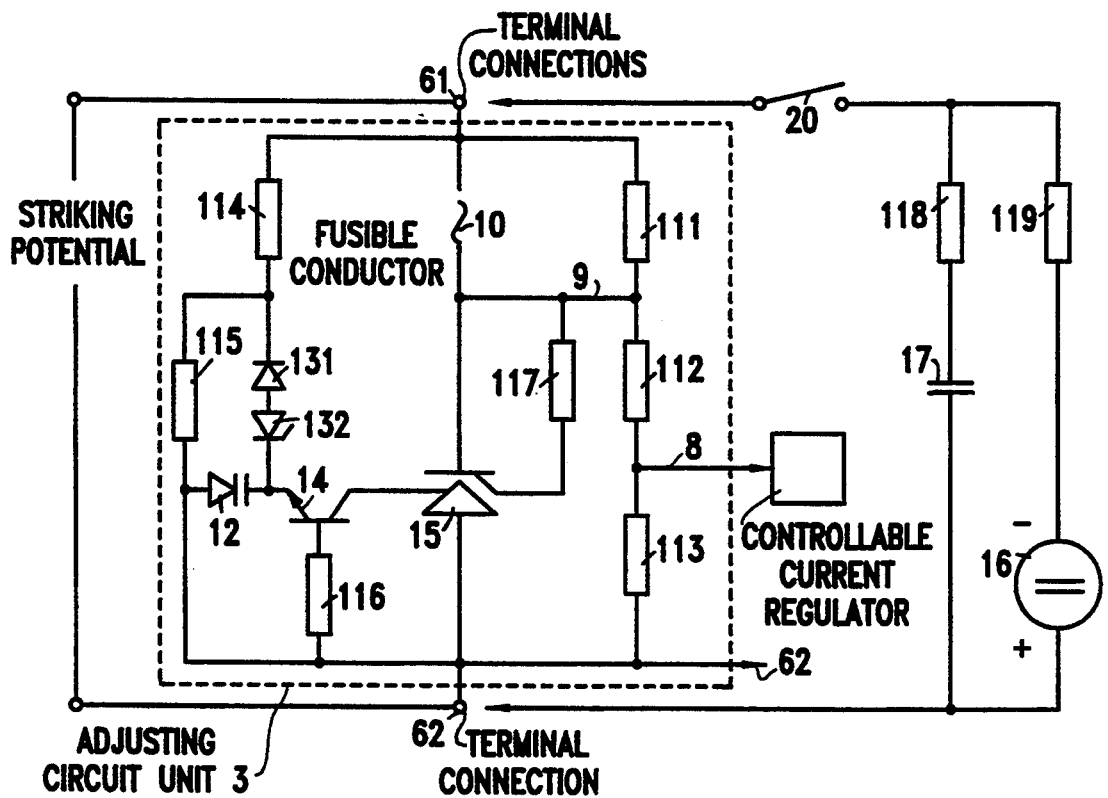
FIG. 10 shows a tenth embodiment of a monolithically integrated circuit according to the present invention.

FIG. 1 shows a block diagram of an integrated circuit 1 having a circuit unit 3 that draws its current for fusing the fusible conductor or the like from the terminal connections for the operating current of the integrated circuit, and draws the striking potential from a further terminal. In the arrangement shown in FIG. 2, the source for the striking potential also supplies the fusing current. In FIGS. 3 and 4, the configurations of FIGS. 1 and 2, respectively, are augmented by two adjusting or programming functions. FIG. 5 depicts the two adjusting or programming functions, i.e., one each for FIG. 1 and FIG. 2. In FIG. 6, the striking potential is obtained from an AND operation formed from two striking potentials. On the other hand, FIG. 7 depicts how two adjusting or programming functions can be controlled by means of one inverter having one terminal connection. In FIGS. 8 and 9, the standard terminal connections have been augmented by one additional terminal connection for striking potentials. Finally, FIG. 10 shows an exemplary, detailed circuit arrangement for the circuit unit 3.

In FIG. 1, reference numerals 61 and 64 refer to the positive and negative poles, respectively, of the operating voltage source for the integrated circuit 1; both terminal connection pair also lead into the circuit unit 3 as a source for the fusing current. The striking potential should be connected to terminal connection pair 62, 64; 62, 61; or to any other terminal connection pair. The circuit unit 3 interconnects with the standard circuit unit 2 via line 8, in order to modify an adjustment, a programming function, or the like. The voltage of the operating voltage source can lie within the range of the standard operating voltage. However, this voltage can instead be selected to have a considerably higher value, particularly when it is applied in synch with the striking potential for a short time only.

Figure 2:
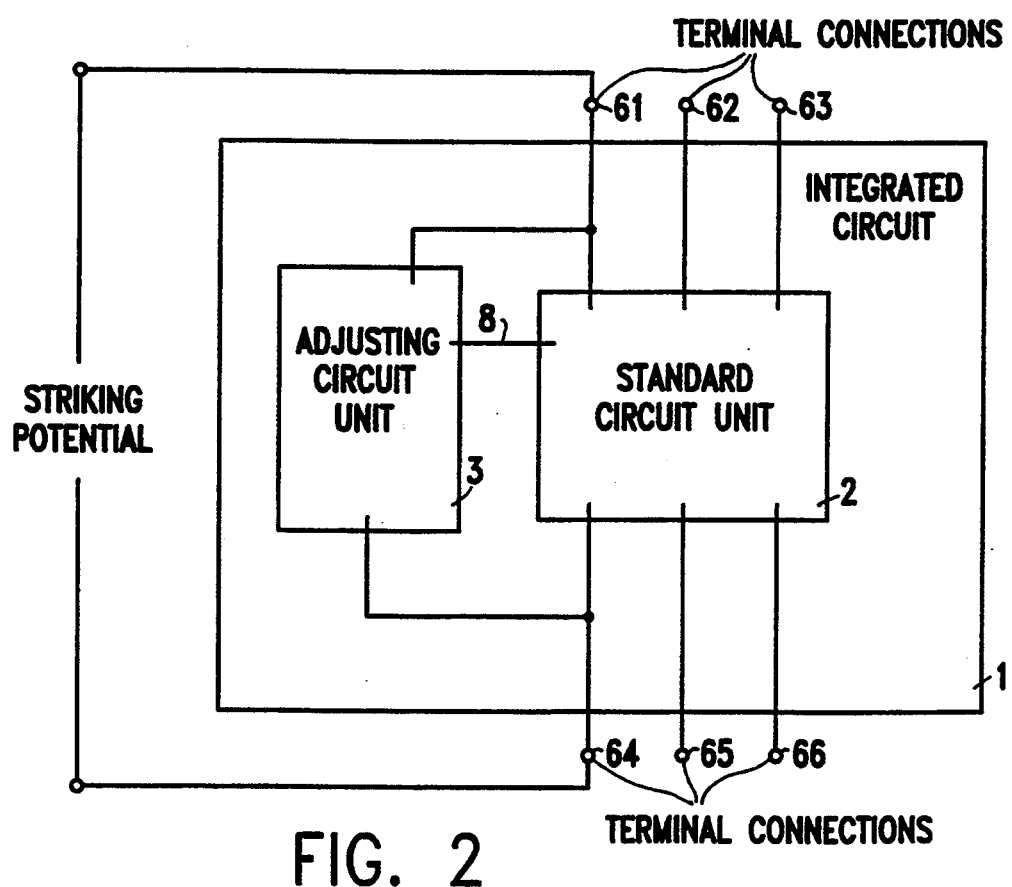
FIG. 2 shows a second embodiment of a monolithically integrated circuit according to the present invention.

Referring to FIG. 2, the source for the striking potential can also supply the fusing current at the same time. As in FIG. 1, the terminal connections 61 and 64 can again be the positive and negative poles, respectively, of the operating voltage. However, any other terminal connections of the integrated circuit can instead be used.

FIGS. 3 through 5 show how the arrangements of FIGS. 1 and 2 can be augmented and combined to include two circuit units 31, 32; in principle, the procedure can be applied to further circuit units 33, 34, etc.

In FIG. 6, the circuit unit 3 is triggered via line 7 by means of a striking potential, which is produced by combining two striking potentials applied at the same time at terminal connections 62 and 63. This procedure can also offer considerable protection against an unintentional firing of the circuit unit 3, when the standard operating potentials are superimposed by interference. If it is guaranteed that the operating potentials of two terminal connections exhibit potential ranges, which are not run-through simultaneously, the striking potentials can also lie within the standard operating range. The procedure can also be augmented to include linking more than two terminal connections.

The arrangement shown in FIG. 7 symbolically indicates how two circuit units 31 and 32 can be triggered by means of only one terminal connection 65 and an inverter 5, for example through the positive and negative polarity of the two striking potentials.

As mentioned above, problems can be avoided by having only one additional terminal connection 67. FIG. 8 shows a possible exemplary embodiment, wherein, for example, the striking potentials for the circuit unit 31 are to be applied to the terminal connections 67, 61, and the striking potentials for the circuit unit 32 are to be applied to the terminal connections 67, 65. Again, FIG. 9 shows an inverter 5, through which means both circuit units 31 and 32 are to be controlled via the terminal connection 67, with one positive and one negative striking potential each.

FIG. 10 shows an input circuit of a controllable current regulator, which has been narrowly toleranced as the result of adjustments made to the wafer specimen. The rise in its transfer characteristic is able to be subsequently corrected with the method according to the present invention, in this case slightly lowered. Reference numeral 62 signifies the ground connection of the integrated circuit, while reference numeral 61 signifies the terminal connection for the control voltage which varies between zero and +7.5 V. Reference numeral 10 refers to the arc gap.

Reference numerals 111–119 refer to resistors. Resistors 112 and 113 form a potential divider, by means of which the rise in the transfer characteristic is determined. The pick-off point of the potential divider is connected via line 9 to the actual circuit regulator. Resistor 111 is a correcting resistor, to which the arc gap 10 is connected in parallel. The potential divider, together with resistors 114 and 115, serves to establish the striking potential. Resistor 116 is an extrinsic base resistor of the npn-transistor 14 in the firing circuit of the planar thyristor 15, which is connected in series to the arc gap 10 between the terminal connections 61, 62. The resistor 117 connects the cathode-side gate of thyristor 15 to its cathode and, in this manner, helps to determine the firing current, which must flow from the transistor 14 to the anode-side gate, to trigger the firing operation.

Other than the potential divider 114, 115, the striking potential is also primarily determined by the Z-diode 132, which is also connected in series to the diode 131, to separate the firing branch within the range of the standard control voltage at connection terminals 61, 62. Reference numeral 12 denotes a barrier-layer capacitor.

The circuit unit 3 operates according to the principle of FIG. 2, i.e., the source for the striking potential also supplies the current for fusing the arc gap 10, whereby the terminal connection 62 is positive and the terminal connection 61 is negative. The impulse capacitor 17, whose impulse current is limited by the low-resistance resistor 118, serves as a source for the striking potential. The impulse capacitor 17 is charged by the voltage source 16 via the highly resistive resistor 119 to approximately 40 V. To reduce the rise in the transfer characteristic, the impulse capacitor 17 is connected by means of the switch 20 to the terminal connections 61, 62.

Current flows in the firing circuit of the thyristor, from the terminal connection 62 through the resistor 116 to the base of the transistor 14, and then to its emitter, in parallel through the anode of the thyristor 15 and the anode-side gate to the collector of the transistor 14, and finally through the Z-diode 132, diode 131, and resistor 114 to the terminal connection 61. Selection means in this circuit arrangement include the diode 131 and the Z-diode 132, supplemented by the integrating element which includes the resistors 114 and 115 and the capacitor 12. The latter is necessary because the terminal connections 61, 62 are connected by a relatively long cable, in which amplitudes of up to 20 V are influenced in the high-frequency interference field. These amplitudes would suffice to make the thyristor 15 conductive and, in this manner, interfere with the functioning of the current regulator. The arc gap would not be endangered, given the low current to be attained.

What is claimed is:

1. An integrated circuit comprising:
   at least one adjusting circuit unit with at least one circuit element;
   at least one standard circuit unit;
   at least two terminal connections coupled to the at least one adjusting circuit unit and the standard circuit unit; and
   the adjusting circuit unit including means for short-circuiting the at least one circuit element to adjust at least one of a characteristic value and a function of the standard circuit unit in response to a striking potential applied to the terminal connections.

2. An integrated circuit comprising:
   at least one adjusting circuit unit with at least one fusible conductor;
   at least one standard circuit unit;
   at least two terminal connections coupled to the adjusting circuit unit and the standard circuit unit; and
   the adjusting circuit unit including means for fusing the at least one fusible conductor to adjust at least one of a characteristic value and a function of the standard circuit unit in response to a striking potential applied to the terminal connections.

3. An integrated circuit comprising:
   at least one adjusting circuit unit with at least one circuit element;
   at least one standard circuit unit;
   at least two terminal connections coupled to the at least one adjusting circuit unit and the standard circuit unit; and
   the adjusting circuit unit including means for short-circuiting the at least one circuit element to adjust at least one of a characteristic value and a function of the standard circuit unit in response to a striking potential applied to the terminal connections, the striking potential being outside of a preselected operating range of potentials.

4. The integrated circuit according to claim 3, wherein the integrated circuit includes a plurality of standard terminals, the striking potential being applied to a selected one of the plurality of standard terminals.

5. An integrated circuit comprising:
   at least one adjusting circuit unit with at least one circuit element;
   at least one standard circuit unit;
   at least two terminal connections coupled to the at least one adjusting circuit unit and the standard circuit unit;
   the adjusting circuit unit including means for short-circuiting the at least one circuit element to adjust at least one of a characteristic value and a function of the standard circuit unit in response to a striking potential applied to the terminal connections; and
   means, coupled to the means for short-circuiting, for separating the striking potential from a preselected potential applied to the at least two terminal connections.

6. An integrated circuit comprising:
   at least one adjusting circuit unit with at least one circuit element;
   at least one standard circuit unit;
   at least two terminal connections coupled to the at least one adjusting circuit unit and the standard circuit unit;
   the adjusting circuit unit including means for short-circuiting the at least one circuit element to adjust at least one of a characteristic value and a function of the standard circuit unit in response to a striking potential applied to the terminal connections; and
   a logic circuit for combining at least two striking potentials to trigger a response of the means for short circuiting.

7. The integrated circuit according to claim 6, wherein at least one of the at least two striking potentials is within a preselected operating range of potentials.

8. The integrated circuit according to claim 6, wherein the integrated circuit has at least two adjustable characteristic values.

9. An integrated circuit comprising:
   at least one adjusting circuit unit with at least one circuit element;
   at least one special terminal connection;
   at least one standard circuit unit;
   at least two terminal connections coupled to the at least one adjusting circuit unit and the standard circuit unit;
   the adjusting circuit unit including means for short-circuiting the at least one circuit element to adjust at least two characteristic values of the standard circuit unit in response to a striking potential applied to the terminal connections; and
   at least one logic element coupled to the at least one special terminal connection for triggering the means for short-circuiting.

10. The integrated circuit according to claim 9, further comprising a plurality of standard terminal connections coupled to the at least one circuit element.

11. The integrated circuit according to claim 9, wherein the at least one circuit element is short-circuited in response to at least two striking potentials.

12. The integrated circuit according to claim 9, further comprising means for separating a striking potential from a preselected potential.

13. The integrated circuit according to claim 12, wherein the means for separating includes at least one semiconductor device having at least one p-n junction selected from the group including a diode, a Zener diode, a transistor, a thyristor, an integrating resistor-capacitor element, and a differentiating resistor-capacitor element.

14. An integrated circuit comprising:
   at least one adjusting circuit unit with at least two fusible conductors;
   at least one standard circuit unit;
   at least one special terminal connection;
   at least two terminal connections coupled to the circuit unit and the standard circuit unit;
   the adjusting circuit including means for fusing the at least two fusible conductors to adjust at least two characteristic values of the integrated circuit; and
   at least one logic element coupled to the at least one special terminal connection for triggering the means for fusing.

* * * * *

UNITED STATES PATENT AND TRADEMARK OFFICE
CERTIFICATE OF CORRECTION

PATENT NO. : 5,394,032
DATED : February 28, 1995
INVENTOR(S) : Gerhard Conzelmann, et al.

It is certified that error appears in the above-indentified patent and that said Letters Patent is hereby corrected as shown below:

Column 4, line 22, "arc gap" should be --fusible conductor--;

Column 4, lines 28-29, "arc gap" should be --fusible conductor--; and

Column 4, line 34, "arc gap" should be --fusible conductor--.

Signed and Sealed this

Thirteenth Day of June, 1995

Attest:

BRUCE LEHMAN

Attesting Officer

Commissioner of Patents and Trademarks